(12) United States Patent
Suhir

(10) Patent No.: US 7,279,916 B2
(45) Date of Patent: Oct. 9, 2007

(54) APPARATUS AND TEST DEVICE FOR THE APPLICATION AND MEASUREMENT OF PRESCRIBED, PREDICTED AND CONTROLLED CONTACT PRESSURE ON WIRES

(75) Inventor: Ephraim Suhir, Los Altos, CA (US)

(73) Assignee: Nanoconduction, Inc., Sunnyvale, CA (US)

( * ) Notice: Subject to any disclaimer, the term of this patent is extended or adjusted under 35 U.S.C. 154(b) by 168 days.

(21) Appl. No.: 11/207,096

(22) Filed: Aug. 17, 2005

(65) Prior Publication Data

US 2006/0073712 A1   Apr. 6, 2006

Related U.S. Application Data

(60) Provisional application No. 60/615,601, filed on Oct. 5, 2004.

(51) Int. Cl.
*G01R 30/02* (2006.01)
(52) U.S. Cl. .................... 324/760; 165/80.3
(58) Field of Classification Search ............... None
See application file for complete search history.

(56) References Cited

U.S. PATENT DOCUMENTS

| | | | |
|---|---|---|---|
| 5,358,032 A * | 10/1994 | Arai et al. ............... | 165/80.3 |
| 5,726,495 A * | 3/1998 | Aihara et al. ............ | 257/722 |
| 5,784,257 A * | 7/1998 | Tata ....................... | 361/704 |
| 6,020,747 A | 2/2000 | Bahns et al. | |
| 6,025,643 A * | 2/2000 | Auger .................... | 257/706 |
| 6,591,897 B1 * | 7/2003 | Bhatti et al. ............ | 165/80.3 |
| 2004/0150100 A1 | 8/2004 | Dubin et al. | |
| 2005/0046017 A1 | 3/2005 | Dangelo | |

OTHER PUBLICATIONS

Falvo, M. R. et al, Bending and Buckling of Carbon Nanotubes Under Large Strain:, Nature, vol. 389, Oct. 9, 1997.
Iijima, S., "Helical Microtubuls of Graphitic Carbon", Nature, vol. 354, pp. 56-58 1991.
Treacy, M. M., Ebbesen, T. W., Gibson, J. M., "Exceptionally High Young's Modulus Observed for Individual Carbon Nanotubes", Nature, vol. 381, pp. 678-680, 1996.
Zhou, O., et al, Defects in Carbon Nanostructures:, Science, vol. 263, pp. 1744-1747, 1994.
Yakobson, B. I. Brabec, C. J., Bernhole, J., "Nanomechanics of Carbon Tubes: Instabilities Beyond the Linear Response", Phys. Rev. Lett., vol. 76, 2511-2514, 1996.

(Continued)

*Primary Examiner*—Ha Tran Nguyen
*Assistant Examiner*—Richard Isla-Rodas
(74) *Attorney, Agent, or Firm*—Michael A. Glenn; Glenn Patent Group

(57) ABSTRACT

The mechanical behavior of wires subjected to axial loading and experiencing bending deformation is used to ensure effective control of the contact pressure in mechanical and/or heat removing devices, and similar structures and systems. An apparatus for taking advantage of the characteristics of wires in packaging of a device, such as a semiconductor device, is disclosed, as well as a test device for identifying the accurate contact pressure required in same. Methods for the prediction of such a behavior for pre-buckling, buckling, and post-buckling conditions in wires, carbon nanotubes (CNTs), and similar wire-grid-array (WGA) structures, for example are also disclosed.

4 Claims, 5 Drawing Sheets

OTHER PUBLICATIONS

Ruoff, R. S. and Lorents, D. C., "Mechanical and Thermal Properties of Carbon Nanotubes", Carbon, vol. 33, pp. 925-929, 1995.

Iijima, S., Brabec. A., Maiti, A., and Bernhole, J., "Structual Flexibility of Carbon Nanotubes", J. Chem. Phys., vol. 104, pp. 2089-2092, 1996.

Lu, J. P., "Elastic Properties of Carbon Nanotubes and Nanoropes", Phys. Rev. Lett., vol. 79, pp. 1297-1300, 1997.

Lourie, O., Cox D. M., and Wagner, H. D., "Buckling and Collapse of Embedded Carbon Nanotubes", Phys. Rev. Lett., vol. 81, No. 8, Aug. 24, 1998.

The J. M. Ney Company Photonic Devision Catalog, 1985.

Suhir, E. and Benedetto, W. E., "Mechanical Evaluation of the "Euler" Test Probe", ASME, 87-WA/EEP-5, Dec. 13-18, 1997.

Timoshenko, S. P., Theory of Elastic Stability, McGraw-Hill, 1961.

Prescott, J., "Applied Elasticity", Dover Publications, New York, 1946.

Suhir, E., Structural Analysis in Microelectronics and Fiber Optics, Van-Nostrand, 1991.

P. Kim et al, Physical Review letters, vol. 87, 2001.

Suhir, E., Applied Probability for Engineers and Scientists, McGraw-Hill, 1997.

* cited by examiner

| □° | 0 | 20 | 40 | 60 | 80 | 100 | 120 |
|---|---|---|---|---|---|---|---|
| T/T$_e$ | 1.000 | 1.015 | 1.063 | 1.152 | 1.293 | 1.518 | 0.884 |
| a/l | 0 | 0.220 | 0.422 | 0.593 | 0.719 | 0.792 | 0.803 |
| b/l | 1.000 | 0.970 | 0.881 | 0.741 | 0.560 | 0.349 | 0.123 |
FIGURE 3
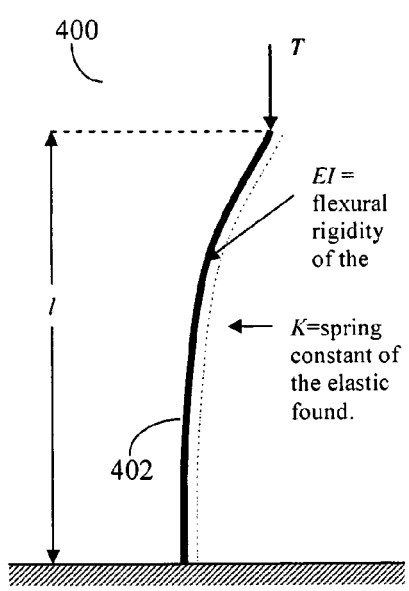
FIGURE 4A
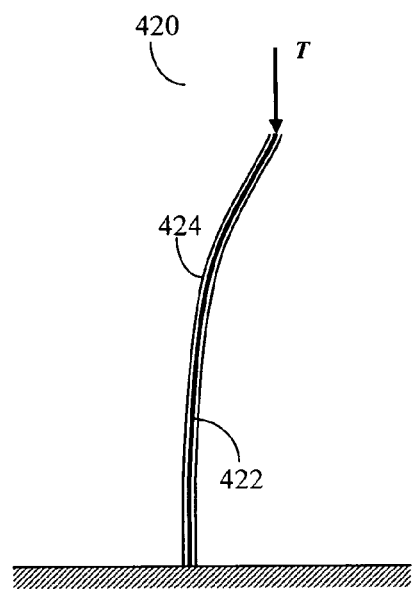
FIGURE 4B

| $\alpha^0$ | $p = \sin\frac{\alpha}{2}$ | K(p) | E(p) | $T/T_e = P/P_e$ | $a/l$ | $b/l$ | $\lambda/l$ | $\chi(p)$ |
|---|---|---|---|---|---|---|---|---|
| 0 | 0 | $\pi/2$ | $\pi/2$ | 1.00000 | 0 | 1.0000 | 0 | 0 |
| 10 | 0.08716 | 1.5738 | 1.5678 | 1.00383 | 0.11076 | 0.9924 | 0.00762 | 0.00154 |
| 20 | 0.17365 | 1.5828 | 1.5589 | 1.01534 | 0.21942 | 0.9698 | 0.03020 | 0.00603 |
| 30 | 0.25882 | 1.5981 | 1.5442 | 1.03507 | 0.32391 | 0.9325 | 0.06745 | 0.01321 |
| 40 | 0.34202 | 1.6200 | 1.5238 | 1.06363 | 0.42225 | 0.8812 | 0.11876 | 0.02263 |
| 50 | 0.42262 | 1.6490 | 1.4981 | 1.10205 | 0.51257 | 0.8170 | 0.18302 | 0.03365 |
| 60 | 0.50000 | 1.6858 | 1.4675 | 1.15179 | 0.59319 | 0.7410 | 0.25900 | 0.04556 |
| 70 | 0.57358 | 1.7312 | 1.4323 | 1.21466 | 0.66263 | 0.6547 | 0.34531 | 0.05761 |
| 80 | 0.64279 | 1.7868 | 1.3931 | 1.29393 | 0.71948 | 0.5593 | 0.44068 | 0.06901 |
| 90 | 0.70711 | 1.8541 | 1.3506 | 1.39324 | 0.76275 | 0.4569 | 0.54312 | 0.07900 |
| 100 | 0.76604 | 1.9356 | 1.3055 | 1.51842 | 0.79141 | 0.3489 | 0.65106 | 0.08689 |

| $P_e, psi$ \ $E, TPa$ | | 5 | 10 | 20 | 30 | 40 | 50 | 60 |
|---|---|---|---|---|---|---|---|---|
| 0.5 | $E_0$ | 8.79 | 35.16 | 140.64 | 316.45 | 562.58 | 879.03 | 1265.8 |
| | $l/d$ | 1496 | 1058 | 748 | 611 | 529 | 383 | 432 |
| 1.0 | $E_0$ | 4.39 | 17.58 | 70.32 | 158.22 | 281.30 | 439.50 | 632.90 |
| | $l/d$ | 2115 | 1496 | 1058 | 864 | 748 | 669 | 611 |
| 1.2 | $E_0$ | 3.66 | 14.65 | 58.60 | 131.85 | 234.40 | 366.26 | 527.40 |
| | $l/d$ | 2317 | 1639 | 1159 | 946 | 819 | 733 | 669 |

FIGURE 10

APPARATUS AND TEST DEVICE FOR THE APPLICATION AND MEASUREMENT OF PRESCRIBED, PREDICTED AND CONTROLLED CONTACT PRESSURE ON WIRES

CROSS REFERENCE TO RELATED APPLICATION

This application claims the benefit of U.S. provisional patent application No. 60/615,601 filed Oct. 5, 2004, which application is incorporated herein in its entirety by the reference thereto

BACKGROUND OF THE INVENTION

1. Field of the Invention

The invention pertains generally to an apparatus and method for device design, prediction of its mechanical behavior and passive control of contact pressure using the phenomena of bending of wires subjected to axial loading, including the phenomenon of elastic stability, and with a particular emphasis on mechanical, electrical, optical, and heat removing devices.

2. Description of the Prior Art

The performance of many mechanical, electrical, optical and thermal devices is sensitive to the level of, and the changes in, contact pressure. For example, a flexible ("Euler", "Cobra", buckled beam) electrical test probe provides an attractive solution to making electrical contact to a large number of close-center probe pads in advanced packages for very large scale integration (VLSI) devices. The pressure provided by such a probe should be high enough to ensure sufficient electrical contact, but low enough not to crack the chip or to cause damage to the probe itself. A similar situation takes place in some fiber-optic based devices, such as, optical sensors, optical connectors, as well as in some heat removing devices. The produced pressure caused by the bent and/or buckled heat conducting wires or carbon nanotubes (CNTs) should be high enough for a satisfactory heat transfer performance of the thermal interface, but low enough not to cause damage to the hot body, which might be mechanically vulnerable, nor to the wires or the CNTs themselves. This requirement often imposes significant restrictions on, and difficulties in, how the wire-grid-array (WGA) is designed, manufactured, and operated. In some applications, such as, CNT-based advanced heat-sinks, it is practically impossible to create a viable and functionally reliable product, if effective and insightful predictive modeling, preferably based on an analytical approach, is introduced and carried out prior to actual design and manufacturing efforts.

Prior art solutions suffer from several deficiencies. Notably, several mechanical and physical design problems arise in connection with such an application, including:

a) Insufficient anchoring strength of the root portion of the rods, including weak adhesion to the base; and b) Extraordinary variability of the diameters and lengths of the grown wires and, because of that, a significant variability and even uncertainty in the produced contact pressure.

Accordingly, it would be advantageous to develop a device, a design methodology and practical solutions to enable one to realistically prescribe, thoroughly predict and effectively control the contact pressure. It would be further advantageous to examine different design options and develop simple and easy-to-use formulae and calculation procedures that enable a WGA designer to choose the appropriate materials and the adequate geometric characteristics of the WGA wires, and predict with high accuracy their mechanical behavior, including contact pressure, displacements, stresses and even the probability of functional and/or mechanical failure.

SUMMARY OF THE INVENTION

The mechanical behavior of wires subjected to axial loading and experiencing bending deformation is used to ensure effective control of the contact pressure in mechanical and/or heat removing devices, and similar structures and systems. An apparatus for taking advantage of the characteristics of wires in packaging of a device, such as a semiconductor device, is disclosed, as well as a test device for identifying the accurate contact pressure required in same. Methods for the prediction of such a behavior in the pre-buckling, buckling, and post-buckling conditions in wires, carbon nanotubes (CNTs), and similar wire-grid-array (WGA) structures are also disclosed.

BRIEF DESCRIPTION OF THE DRAWINGS

FIG. 3 is a table describing the post-buckling behavior of a wire and showing results for the ratio of actual compressive force to critical (Euler) value of this force, the ratio of the lateral displacement (lateral coordinate) of a wire's end to the initial (non-deformed) length of the wire, and the ratio of the axial displacement (axial coordinate) of the wire's end to the initial (non-deformed) length of the wire vs. different values of the rotation angle at the end of the wire, which experiences large (highly nonlinear) elastic deformations under the action of a compressive force, which is applied to the end of the wire in the axial direction;

FIGS. 4a and 4b are schematic diagrams showing wires, idealized as beams, lying on, or embedded in, a continuous elastic or inelastic foundation (medium) and subjected to a compressive force applied to the wires' free end;

FIG. 10 is a table showing an example of data for the actual physical design of a CNT array ("forest") module.

DETAILED DESCRIPTION OF THE INVENTION

The invention disclosed herein uses the phenomena of bending and the elastic stability or instability of rods, whether free-span, i.e. un-embedded into any elastic or inelastic continuous medium, rods, or those that can be idealized as beams lying on continuous foundations. In accordance with one embodiment of the invention, these phenomena are used to provide and control the required contact pressure for a wire-grid-array (WGA). A key objective of the invention is to develop a WGA design that is least sensitive to the inevitable variations in materials' properties and wire ("beam") geometries (diameters, lengths, prismaticity, etc.). The WGA may comprise of, but not limited to, a plurality of rods, which include, but are not limited to, nano-rods, nano-wires, carbon nanotubes (CNT), optical fibers, carbon nano-fibers, Gecko type "hair", Velcro-type elements, and the like. For the purpose of this disclosure, the terms wire(s) or rod(s) are used interchangeably to indicate, without limitation, nano-rods, nano-wires, carbon nanotubes (CNT), wires, beams, pillars, optical fibers, carbon nano-fibers, Gecko type "hair", Velcro®-type elements, and the like, where a wire is any structural element that is subjected to bending by the application of an axial bending force, with or without actual bending of the wire. In accordance with the invention, a wire may or may not be partially or fully embedded within an embedding material, as discussed in more detail below.

Figure 1:
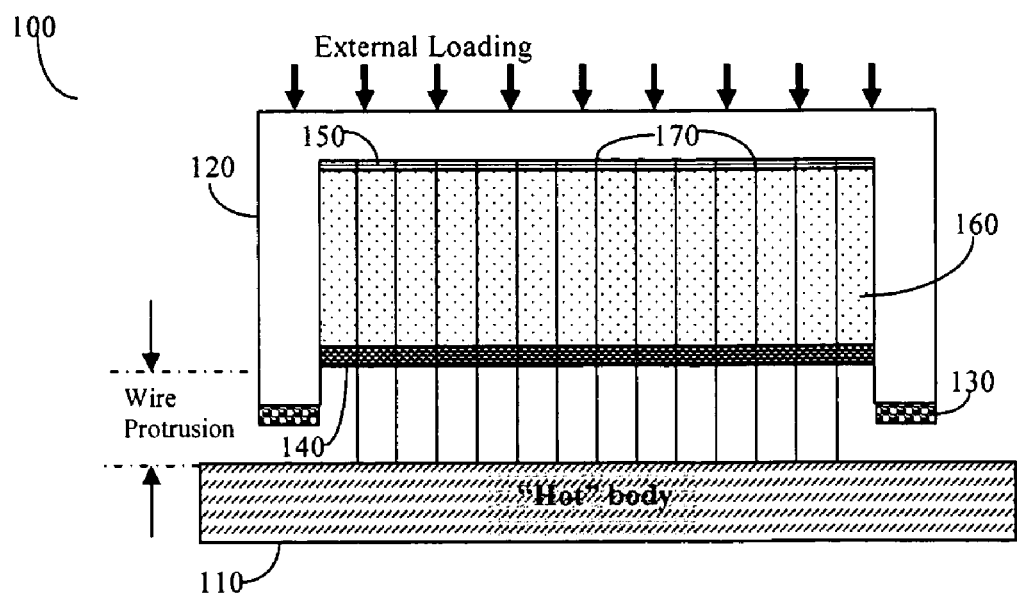
FIG. 1 is a cross-sectional view of an exemplary embodiment of a device with a WGA that could be bent or buckled.

Reference is now made to FIG. 1 where an array of rods, for example a CNT array, intended for heat removal, is shown. The rods 170 may be of a composed type, with or without an initial curvature, and lateral ("ends offset") and/or angular misalignment of the wire ends. It has been found (see, for instance, P. Kim et al., Physical Review Letters, vol. 87, 2001) that CNTs can provide extraordinary high heat transfer capabilities and therefore there is an obvious incentive to employ them in heat removing devices.

In accordance with the invention, it is disclosed that WGAs, such as vertically aligned multi-walled rods, are manufactured on silicon or non-silicon, e.g. metal bases, silicon wafers, etc., where the root portions of the CNTs are positioned, or otherwise anchored within a single or multi-layer structure, having a sufficiently high effective Young's modulus and a sufficiently high coefficient of thermal expansion (CTE), intended to provide a reliable anchoring of the WGA root portion, as well as better heat transfer. The structure 150 is placed inside of the base 120, that may further include spacers 130 that provide an adequate protrusion of the CNTs so that their axial displacements under the action of the axial forces are not larger than necessary for their compression-induced bending or buckling. The spacers 130 are placed between the base 120 and a hot body 110, the hot body being, for example, the back side of a semiconductor chip. Hot body 110 provides a contact interface and an area of contact pressure. The WGA is further placed in a low modulus continuous medium (further referred to as "low modulus material", or LMM) 160, in which the rods 170 are fully, or partially, embedded and which has, if necessary, good heat transfer and other useful mechanical and physical characteristics, such as the right viscosity, good wettability with respect to the contact materials, etc. In addition, an optional single or multi-layer structure 140 may be needed to provide a second support for the WGA to make its performance, as far as contact pressure is concerned, more consistent and predictable. The rods or wires 170 protrude beyond the walls of the base, i.e. substrate, 120 and establish contact with hot body 110 prior to establishing of contact by spacers 130 of base 120.

Figure 2:
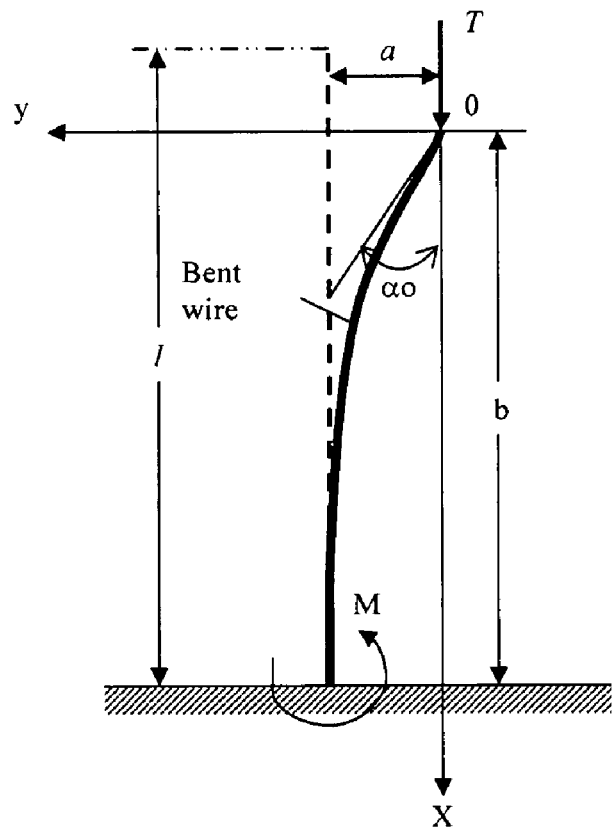
FIG. 2 is a schematic diagram of a wire experiencing large elastic deformations.

Reference is now made to FIG. 2, which shows a schematic of a wire experiencing large, non-linear, elastic deformations, and to FIG. 3 where a corresponding table shows values in respect of the bending angles. Accordingly, the data in FIG. 3 enable the determination of the required protrusion and the required axial displacement for the given (designed) pressure for the initially straight or bent wire clamped at its low end and free at the other. The critical (Euler) force is determined, for a wire that could be idealized as a cantilever beam, as:

$$T_e = \frac{\pi^2 EI}{4l^2} = \frac{\pi^3 Ed^4}{256l^2} \quad (1)$$

FIG. 4A, shows a schematic 400 of a wire 402 that can be idealized as a beam lying on a continuous elastic foundation. In this case the critical (Euler) force is expressed as:

$$T_e = 2\sqrt{KEI} = \frac{1}{4}d^2\sqrt{\pi KE} \quad (2)$$

where K is the spring constant of the foundation. The critical pressure induced by this wire is:

$$p = \sqrt{\frac{KE}{\pi}} \quad (3)$$

and it is, therefore, independent of the wire length and diameter. In a typical and exemplary nanotube, the diameter of the wire is in the range of 20-50 nanometers, and the wire length is 20-100 micrometers. The buckling pressure to be applied is for a typical and exemplary nanotube in the range of 10-100 pounds per square inch (psi). In one embodiment of the invention, and as further shown in schematic 420 of FIG. 4B, the wire 422 is coated by a coat 424, the coat being, for example, of heavy metal such as copper, gold, titanium, nickel, or the like, for the better mechanical and, optionally better thermal performance of the WGA. The main objective of this coat, as far as the mechanical behavior of the wire is concerned, is to lead to a greater distributed weight of the wire 422, so that a lower force, T, is required to buckle the wire. Specifically, a coated wire is essentially closer to its buckling point, but nevertheless is still at its pre-buckling state.

In yet another embodiment of the invention, the upper portion of the coat 424, that may be in contact with another surface (for example with the surface of a semiconductor chip), is further coated with a liquid resistant, or barrier, material such as Teflon, to avoid direct contact between the wet surface of an LMM, as described in ore detail above, and the surface of such a chip. The main objective of such a barrier, also referred to as a "creep barrier", material is to keep the LMM trapped within the WGA and not to allow the LMM to "creep out" the WGA. A person skilled-in-the-art would readily realize that the teachings above may be applied separately or in any combination to achieve the desired results, without departure from the scope and spirit of the invention.

Figure 5:
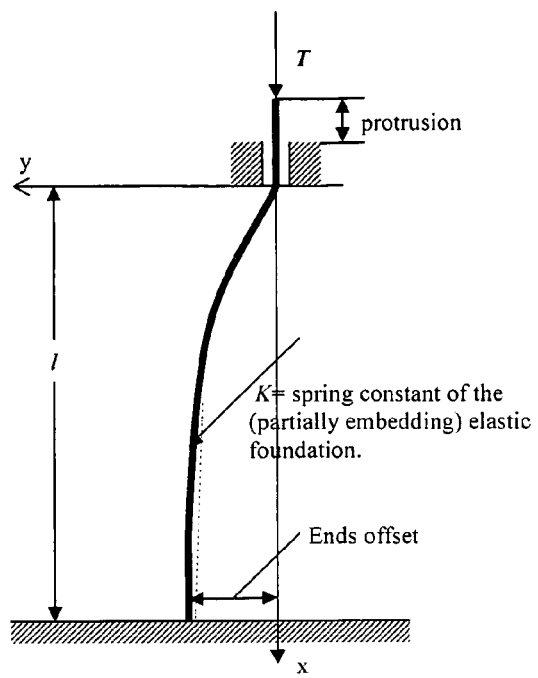
FIG. 5 is a schematic diagram showing an initially curved wire clamped at its ends, lying on a (partial) elastic foundation and subjected to compression.

FIG. 5 shows a schematic of an initially curved wire with two ends clamped and partially supported by an elastic foundation. Notably, a wire with an initial curvature, and/or ends offset, behaves as a nonlinear spring, in which the axial and lateral displacements gradually increase with an increase in the applied axial force, while an initially straight wire remains straight up to the very moment of buckling. In the actual design the wire may or may not be embedded (fully or partially) into a LMM, and the LMM can be based on an organic (e.g., silicone gel type) or inorganic (e.g., Ga, In—Ga or any other low temperature melting alloy, which is liquid at room temperature, and, or at the operating temperatures) material.

Figure 6:
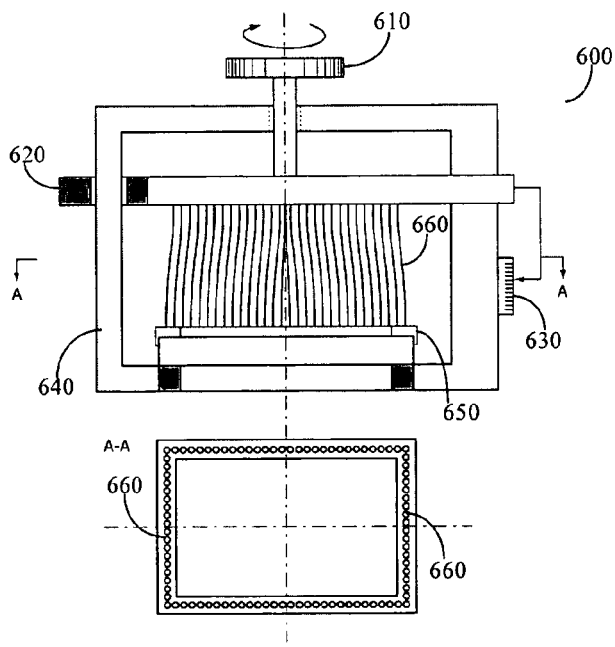
FIG. 6 is a schematic diagram showing of an "Euler" test vehicle.
Figure 7:
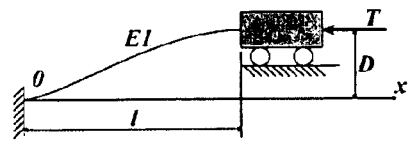
FIG. 7 depicts the mechanical behavior of a wire with an offset of its ends, clamped at its ends, and subjected to compression.

In accordance with the invention, an Euler test vehicle is designed for applying a given pressure to a specimen under operation and/or test, for the purpose of keeping the pressure within a relatively narrow and desired, or otherwise required, limit. The mechanical behavior of the test vehicle shown in FIGS. 6 and 7 is based on the use of the phenomenon of buckling of rods (wires). The initial curvature, and/or ends offset, does not change the critical (buckling) force, but has a favorable effect on the pre-buckling behavior of the wires: in a wire with an initial curvature (offset of its ends) the lateral and axial deflections increase gradually when the applied axial (compressive) force changes from zero to its finite (including critical) value and acts as a nonlinear spring, while an initially straight wire remains straight up to the very moment of buckling, and starts exhibiting its spring effects only in the post-buckling mode.

The principle of the operation of the device shown in FIG. 6 is made apparent in conjunction with the drawing in FIG. 7. The pressing element 600 is designed in accordance with the dimensions of the tested specimen. The pressure is applied by rotating a screw 610. The threads of screw 610 should be fine enough to ensure accurate axial displacement and corresponding pressure. The axial motion and applied pressure is read from a dial 630. Alternatively, a strain gage of any kind could be used to measure the induced force and, if necessary, the corresponding axial displacement. Any non-contact way of measuring the axial displacements is also possible, for example, measuring the electrical capacitance between the WGA base and the specimen under test. In one embodiment of the invention, wires 660 are arranged around the periphery of a test specimen 650, leaving the mid-portion of the specimen 650 accessible. In yet another embodiment of the invention, the wires are arranged in accordance with the array of wires of a conceived device. The vertical structural elements 640 are of a circular cross-section. Pressure is applied to the wires 660 by means of a plate 620 that is displaced vertically by the turn of the screw 610. Hereinafter, there is provided a detailed discussion of the various types of behaviors discussed in general terms above.

Critical Force and Contact Pressure for a Cantilever Free-Span Wire with an Initial Curvature (Pre-Buckling and Buckling Modes).

The differential equation of bending for such a wire is:

$$EIw^{iv}(x)+T[w''(x)+w_0''(x)]=0 \quad (4)$$

where $w(x)$ is the deflection function, $w_0(x)$ is the initial curvature, EI is the flexural rigidity of the wire and T is the applied axial force. Equation (4) takes into consideration the fact that the bending moment produced by the compressive force T is due to both the initial curvature of the wire and to its force-induced curvature. The total deflection of the wire can be found as:

$$w(x) = \frac{f_0}{1 - \frac{T}{T_e}} \sin\frac{\pi x}{2l} \quad (5)$$

where $f_o$ is the maximum initial deflection, l is the initial length of the wire span, and $$T_e = \frac{\pi^2 EI}{4l^2} = \frac{\pi^3}{256} E\left(\frac{d^2}{l}\right)^2 \quad (6)$$

is the buckling (critical) force. The pressure produced by WGA can be easily found as:

$$p = \frac{\pi^2}{64}\eta E\left(\frac{d}{l}\right)^2 \quad (7)$$

where η is the portion of the total area covered by the wires, indicating the percentage of the total area of the CNT base that actually experiences the compressive force, E is Young's modulus of the wire material, and d/l is the ratio of the wire diameter to its respective length.

The axial displacements can be found as:

$$\lambda = \frac{1}{l}\frac{\pi^2}{16}\frac{f_0^2}{\left(\frac{T_e}{T}-1\right)^2} \quad (8)$$

The formulas 4-8 enable one to design the WGA for the required pressure in the pre-buckling mode.

Critical Force and Contact Pressure for a Cantilever Free-Span Wire (Post-Buckling Mode).

It is assumed that in the post-buckling mode, the initial curvature does not have to be considered. The distances a and b, shown in FIG. 2, can be found as:

$$a = \frac{2p}{k}, b = \frac{2}{k}E(p) - l, \quad (9)$$

where $$p = \sin\frac{\alpha}{2}, k = \sqrt{\frac{T}{EI}}, l = \frac{K(p)}{k}, \quad (10)$$

and the functions K(p) and E(p) elliptic integral of the first and the second kind respectively, are tabulated. The calculated data are shown in the table in FIG. 3.

In practical calculations, one should assume certain $T/T_e$ ratios and evaluate the corresponding a/l ratios and b/l ratios. Then determine the critical force using formula (6), and the value of the actual compressive force $T \geq T_e$. Then one should determine, for the a value from the table in FIG. 3, the module $p=\sin(\alpha/2)$ of the elliptic function and the parameter k from the second formula in (10). Then one should determine the functions K(p) and E(p) from the existing mathematical table shown in FIG. 3. Then determine the l value from the third formula in (10). Then one should determine the a and b distances from the known a/l and b/l ratios. The required length-to-diameter ratio can be found from the formula (7) for the given pressure p as $$\frac{l}{d} = \frac{\pi}{8}\sqrt{\eta\frac{E}{p}} \qquad (11)$$

Critical force and Contact Pressure for a Wire (CNT) Embedded with a Low Modulus Medium (Pre-Buckling and Buckling Modes).

In the case of a fully embedded wire, the buckling force of a wire of a circular cross-section can be found as:

$$T_e = 2\sqrt{KEI} = \frac{d^2}{4}\sqrt{\pi KE} \qquad (12)$$

where K is the spring constant of the elastic foundation provided by the LMM.

The induced pressure can be computed as:

$$p = 2\eta \sqrt{\frac{(1-v)(3-4v)EE_0}{(1+v)\left[(3-4v)^2\ln\frac{r_1}{r_0} - \frac{r_1^2/r_0^2-1}{r_1^2/r_0^2+1}\right]}} \qquad (13)$$

where v is Poisson's ratio of the low modulus medium, and $$\frac{r_1}{r_0} \cong \frac{(3-2v)(3-4v)+1}{2(1-v)(3-4v)s}, \qquad (14)$$

where s is a small enough number. Formulas (13) and (14) presume that the pressure p is produced by a LMM region that experiences appreciable deformations due to the bent (buckled) wire.

With ν=0.5, s=0.1, and v=0.25, formula (14) yields:

$$p = 0.186\sqrt{EE_0} \qquad (15)$$

where E is Young's modulus of the CNT material and $E_0$ is Young's modulus of the embedding material, which is idealized as a low modulus medium. As one sees from the formulas (13) and (15), the induced pressure depends only on the Young's modulus of the material and is independent of the diameter-to-length ratio of the wire. Formula (15) indicates also that the required (for the given contact pressure) compliance of the LMM is dependent on the Young's modulus of the WGA material.

A person skilled-in-the-art would appreciate that the disclosed invention is not limited to a single application and, without limiting the scope of the invention, the invention is applicable to multiple forms of rods or wires. These include, but are not limited to, wires, nanotubes, nano-rods, Gecko-type "hair", Velcro-type elements, etc. Hence, a device and a test device for creating a predetermined ("prescribed"), predicted and controlled contact pressure, for any application, by using the phenomenon of elastic stability of rods or the bending deformation of initially deflected rod (wire)-like elements, is therefore shown. Either the total lengths of the wires or only their protruded portions may be subjected to bending, i.e., experience elastic instability, or buckling, as a result of the application of the axial force.

In addition, pre-buckling, buckling and post-buckling (highly nonlinear) deformations (deflections) of rods (wires, CNTs, etc.) are considered, and the mechanical behavior of the wires is predicted with high accuracy, whether on a deterministic or a probabilistic basis, with an emphasis on the produced contact pressure, and is further addressed. The device is further designed for removing heat from a hot surface, such as a high power chip.

A device in accordance with the disclosed invention is designed for flexible ("Euler") electrical test probes, for ferruled high-density fiber array connectors, and/or for an "Euler" test vehicle, which is intended for providing the required lateral pressure on a specimen under test. The wires in such a device may be obliquely oriented with respect to the base. The wires can be straight or can have a more complicated configuration. Such a configuration can be achieved by providing unidirectional plasma flow and/or unidirectional air blow during the fabrication of the rods/wires. The flow can be initiated at different points of time and its intensity can be changed/adjusted depending on the particular wire configuration that is intended to be achieved.

Furthermore, a device in accordance with the invention may be designed for the experimental evaluation of Young's modulus of a rod/wire material from the measured axial force and the corresponding displacement, and based on the developed analytical predictive model that enables one to evaluate the said Young's modulus from linear or nonlinear elastic deformations of the wire. This can be achieved by measuring the axial force and the axial displacement, by solving the equation for the Euler force for the Young's modulus of the material, and by computing this modulus for the measured force and the displacement for different load levels. This technique can reveal also any nonlinear relationship, if any, between the force (stress) and the displacement (strain).

In another embodiment of the disclosed device cantilever ("clamped-free", i.e., clamped at one end and free at the other) rods/wires are used. In some other cases (in the case of, say, "clamped-clamped" wires), both ends of the rods/wires are supported. Specifically, while the root end of the wire is rigidly clamped (firmly anchored), the upper end, although restricted from angular deformations, can slide in the axial direction under the action of a compressive force applied to its tip. The angles of rotation at both ends are supposed to be zero or next-to-zero, if the support is not ideally rigid, during the wire deformation. In yet another embodiment of the invention the initial curvature (and/or the ends offset) is predefined, introduced and considered in the pre-, post- or buckling modes of wire performance. Furthermore, the geometry of the wires (length, diameter, initial curvature, ends offset) may be predefined (established beforehand), and their mechanical behavior can be predicted with high accuracy, based on the developed analytical models. The wires may be further coated in one or more layers for improved mechanical behavior in bending and buckling.

In yet another embodiment of the invention the root portions of the rods are reliably anchored using, if necessary, high modulus, high CTE, and, in the case of thermal devices, also highly thermally conductive materials. These materials can be applied onto the wire grid array (WGA), for example, by chemical vapor deposition, physical vapor deposition, plasma deposition, ion sputtering, electrochemical deposition, by casting from liquid phase, or in any other suitable way. The employment of a LMM (whose matrix can be based on a silicone gel type material; highly viscous and, if necessary, thermo-conductive fluid; thermal grease, including phase changing materials; low-temperature melting metals, such as, e.g. Ga and In—Ga alloys, etc)., enables one to convert a free-span wire to a wire whose mechanical behavior can be idealized as those for a beam lying on a continuous elastic foundation. The employment of a LMM can be needed for lesser sensitivity of the contact pressure to the variations in the wire parameters. The resulting pressure is wire length and its diameter independent and depends only on the Young's modulus of the wire material and the spring constant of the elastic foundation (embedding medium). In addition, the employment of a LMM provides reliable separation between rods, thereby avoiding direct contact of the rods with each other (a "spaghetti" situation) and further stabilizing the mechanical behavior of the WGA. The LMM may have a high thermal conductivity if such is necessary, as well as adequate viscosity, good wettability, and other physical and chemical attributes, if such properties are also important for successful manufacturing and performance of the module.

In yet another embodiment of the invention there is employed a high modulus, low CTE material for providing a secondary support for the upper end of long enough rods, if such a support is deemed to be necessary for a more consistent mechanical and/or functional performance. Notably, in accordance with the invention, partially or totally embedded wires with constant or variable mechanical characteristics of the embedding medium, are also possible. The end portions of the wires may be further embedded into a low modulus and highly thermally conductive material that is filled with various highly conductive particles, including nano- and/or micro-particles and CNT fibers. The device may be attached to the hot body by using the Gecko phenomenon and/or Velcro concept and/or vacuum air caps, or in any other way.

It is further noted that vander Walls forces of different nature may be responsible for the Gecko effect and are further enhanced due to the application of an external electric field. While Gecko wires supposedly have only orientation-related forces, the induced and dispersion Vander Walls forces can be used, in addition to the orientation forces, to enhance the Gecko effect.

The disclosed device may be designed on the basis of a probabilistic approach, which takes into consideration various inevitable uncertainties and variabilities of the materials and geometric characteristics of the WGA and is used to ensure that the probability to find the contact pressure within the required range is sufficiently high. The probabilistic approach can be used also to revisit the design and materials selection, if the predicted probability of a functional and/or materials failure is higher than the acceptable level.

A person skilled-in-the-art would realize that the benefits of the disclosed invention may be easily adaptable for use in engineering applications well beyond the described applications, in the fields of engineering such as civil, electrical, mechanical, ocean, aerospace, automotive, and structural engineering, to name but a few. Therefore, the disclosure herein above should be read to be equally useful in other areas of engineering, without limitations of the specific examples provided herein.

The analysis hereinafter is provided for the purpose of further teaching related to the above invention and assisting in the understanding of the considerations taken in practicing the invention. The analysis is not intended to limit the invention, but rather provide a certain theoretical basis for the invention hereinabove. Specifically, flexible wire-like structural elements subjected to axial compression and experiencing bending deformations in the pre-buckling, buckling or post-buckling modes ("Euler" rods) have been used to provide a desirable spring effect in some mechanical, electrical and optical devices. In the analysis that follows we model the mechanical behavior of cantilever wire-like elements subjected to axial compression having in mind primarily thermal interfaces that employ carbon nano-tube (CNT) arrays ("forests"). The obtained formulas enable one to design a CNT or any other wire-grid array (WGA) with the prescribed, predicted and controlled interfacial (contact) pressure. They also enable one to predict the configurations (elastic curves) of the wires. The contact pressure should be high enough for the adequate performance of the device, but low enough not to compromise the strength of the contact materials. We intend to examine free span wires, as well as wires embedded into an elastic medium. By embedding a WGA into a LMM one can make the contact pressure insensitive to variations in the geometric characteristics of the WGA. We suggest that, if possible, the WGA is designed in such a way that the wires operate in buckling and/or slightly post-buckling conditions. In such a case, the induced pressure is least sensitive to variations in the axial displacements and remains close to the buckling pressure.

The analysis performed is based on the following assumptions:

a) Wire-like structural elements in question can be idealized as cantilever beams (flexible rods/wires), and the engineering theory of bending and buckling of beams can be used to analyze their mechanical behavior;

b) Structural elements in question perform elastically for any stress/strain level;

c) Stress-strain relationship for the WGA material is linear, i.e. stress/strain level independent;

d) WGA wires are characterized by large length-to-diameter ratios, so that the shearing deformations need not be accounted for; this is generally true, as long as these ratios are larger than, say, 12-15;

e) Hollows in wire structures, if any, are small, do not affect their mechanical behavior and need not be considered;

f) Wires are rigidly clamped at their root cross-sections and free at the other ends;

g) Contact surface (interface) is ideally smooth and does not restrict the lateral displacements of the wire tips at any strain/displacement level;

h) Wire-like structural elements embedded into a LMM can be treated, or otherwise idealized, as flexible beams lying on a continuous elastic foundation provided by such a medium;

i) Spring constant of the elastic foundation provided by the LMM should be evaluated, however, for a wire-like element embedded into, but not actually lying on, an elastic medium, i.e. by considering the fact that the wire is surrounded by, and is attached to, the LMM;

j) Elastic modulus of the wire material is significantly higher than the modulus of the embedding medium, and therefore the circumferential shape of the wire cross-section remains circular during the wire deformations; in other words, the spring constant of the elastic foundation can be evaluated assuming that the cross-section of the wire is displaced, but is not deformed; and k) Initial curvatures (deflections) of the wire-like elements affect the pre-buckling (linear) behavior of the wire, but do not affect the large post-buckling deflections of the wires.

Following there is provided an analysis of free-span wires, beginning with the behavior in the pre-buckling mode.

The equation of bending (equilibrium) for a wire-like structural element subjected to axial compression is as follows:

$$EIw^{IV}(x)+T[w^{II}(x)+w_0^{II}(x)]=0. \quad (16)$$

Here $w(x)$ is the (force-induced) deflection function, $w_0(x)$ are the initial (stress free) deflections that can be represented as $$w_0(x) = f_0 \sin\frac{\pi x}{2l}, \quad (17)$$

where EI is the flexural rigidity of the wire, E is the Young's modulus of the wire material, $I=\pi d^4/64$ is the moment of inertia of the wire cross-section, d is its diameter, l is the wire length, $f_0$ is the maximum initial deflection (at the wire tip), and T is the compressive force. The origin, 0, of the coordinates x,y is at the free end of the wire. The axis x is perpendicular to the clamped cross-section, and the axis y is parallel to this cross-section.

The approximate solution to the equation (16) in the form (17) is sought as:

$$w(x) = C \sin\frac{\pi x}{2l}, \quad (18)$$

where C is the constant of integration. Expression (17) and its solution (18) are consistent with the boundary conditions:

$$w(0)=0, w^{II}(0)=0, w^{I}(l)=0, w^{III}(l)=0 \quad (19)$$

These conditions indicate that the deflection and the bending moment at the wire's free end at the given force level are zero, and so are the rotation angle and the lateral force at the wire's root cross-section. Introducing the formulas (17) and (18) into the equation (16) we find that:

$$C = \frac{f_0}{\frac{T_e}{T} - 1}, \quad (20)$$

where $$T_e = \frac{\pi^2 EI}{4l^2} = \pi^3 E \left(\frac{d^2}{16l}\right)^2 \quad (21)$$

is the critical (Euler) force for a cantilever beam. Then the solution (18) results in the following formula for the force-induced deflection:

$$w(x) = \frac{f_0}{\frac{T_e}{T} - 1} \sin\frac{\pi x}{2l} \quad (22)$$

The total deflection is $$w_t(x) = w_0(x) + w(x) = \frac{f_0}{1 - \frac{T}{T_e}} \sin\frac{\pi x}{2l} \quad (23)$$

The axial force-induced displacement of the wire tip can be found as $$\lambda = \frac{\lambda_0}{\left(\frac{T_e}{T} - 1\right)^2}, \quad (24)$$

where $$\lambda_0 = \left(\frac{\pi}{4}\right)^2 \frac{f_0^2}{l} \quad (25)$$

is the initial (stress-free) displacement. From (24) it can be easily found that:

$$T = \frac{T_e}{1 + \sqrt{\frac{\lambda_0}{\lambda}}}, \quad p = \frac{p_e}{1 + \sqrt{\frac{\lambda_0}{\lambda}}}, \quad (26)$$

where $$p = \frac{4T}{\pi d^2} \quad (27)$$

is the actual contact pressure and $$p_e = \frac{4T_e}{\pi d^2} = E\left(\frac{\pi d}{8l}\right)^2 \quad (28)$$

is its critical value.

The following conclusions could be drawn from the above analysis:

a) Within the framework of the taken approach, the actual force (pressure) reaches half of its critical value, when the force-induced axial displacement becomes equal to the initial axial displacement;

b) A linear approach predicts accurately the critical force (pressure), while the formulas for the predicted displacements are valid only for displacements that are considerably lower than their critical values;

c) While the total deflection can be obtained as a sum of the initial deflection and the force-induced deflection, the total axial displacement cannot be found in the same fashion; this is because the axial compliance (spring constant) is displacement dependent, i.e. the force-displacement relationship is not linear;

d) The actual and the critical forces are proportional to the wire diameter to the fourth power (because they are proportional to the moment of inertia of the cross-section), and are therefore sensitive to the change in this diameter. The corresponding pressures, however, are proportional to the diameter-to-length ratio squared, and, for this reason, are less sensitive to the variability in the wire diameter; and e) It is the diameter-to-length ratio that defines the pressure level, and not the diameter and the length taken separately.

The axial compliance of the wire can be found as the ratio of the axial displacement of the wire tip to the corresponding compressive force as follows:

$$C = \frac{\lambda}{T} = \frac{\lambda_0}{T\left(\frac{T_e}{T} - 1\right)^2} = \frac{\sqrt{\lambda}\left(\sqrt{\lambda} + \sqrt{\lambda_0}\right)}{T_e} \quad (29)$$

This formula indicates that indeed the initial deflection and the axial displacement need not be considered if the force-induced axial displacement $\lambda$ is substantially larger than the initial axial displacement $\lambda_0$. This takes place, when the wire performs in the near-buckling, buckling or post-buckling mode. In such a situation, i.e. when the initial displacement is either zero or need not be accounted for, the wire compliance can be evaluated as $$C = \frac{\lambda}{T_e} \quad (30)$$

Let, for instance, a CNT array ("forest") is used as a suitable WGA. Assuming that the Young's modulus of the CNT material is as high as:

$$E = 1.28 TPa = 1.306 \times 10^5 \text{ kg/mm}^2 = 185.7 \text{ Mpsi}^6,$$

putting CNT length and diameter as l=40 μm, d=40 nm, and using the formula (21), it can be easily found that the critical force is $T_e = 2.531 \times 10^{-11}$ kg. Let, for instance, only 40% of the contact area be covered by the WGA. Then the predicted contact interfacial pressure due to the buckled CNTs is:

$$p_e = \eta \frac{4T_e}{\pi d} = \eta E \left(\frac{\pi d}{8l}\right)^2 = 8.056 \times 10^{-3} \text{kg/mm}^2 = 11.5 \text{ psi} \quad (31)$$

Figures 8, 9:
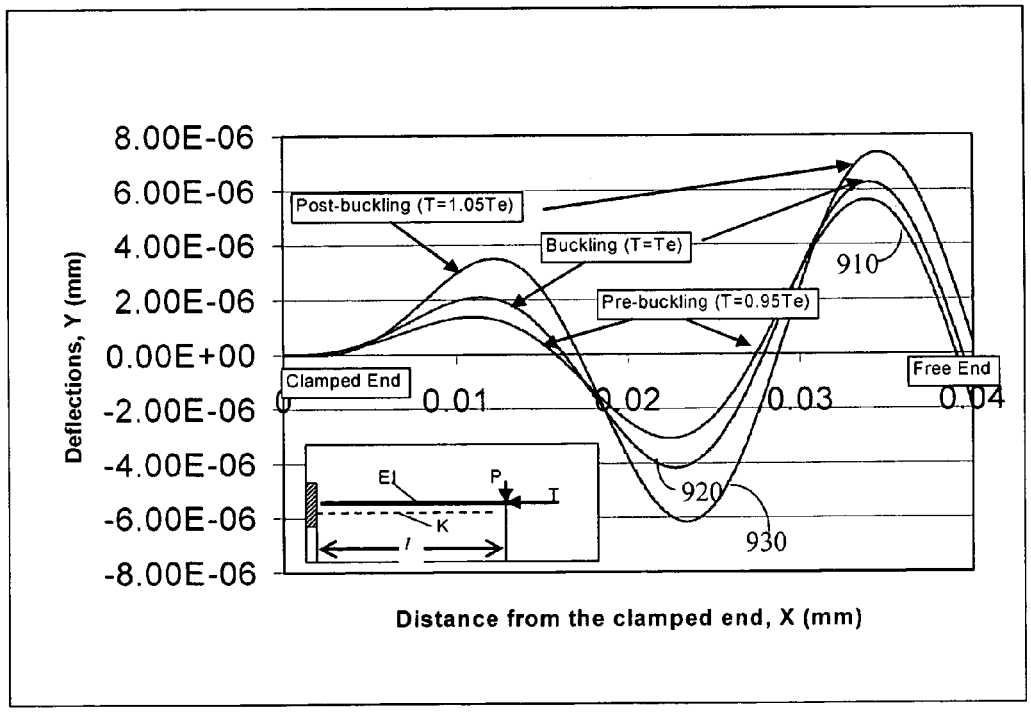
FIG. 8 is a table showing values of the applied ("interfacial") pressure p, the ratio $T/T_e = p/p_e$ of the actual compressive force (pressure) to its critical value, the ratios a/l, b/l, of the lateral, a, and the axial, b, coordinates of the wire tip to the wire's initial length, l, and the ratio $\lambda/l = 1 - b/l$ of the axial displacement $\lambda$ to the wire's initial length, l computed for different a values.
FIG. 9 is a diagram showing examples of elastic curves of a deflected wire in its pre-buckling, buckling, and immediate, i.e. close to buckling, post-buckling condition.

The post-buckling behavior of the wire can be evaluated, for large deflections, using the "elastica" model. The initial length, l, of the wire, the ratio $T/T_e = p/p_e$ of the actual force (pressure) to its critical value, and the coordinates y=a (parallel to the clamped cross-section) and x=b (perpendicular to the clamped cross-section) of the wire's root end with respect to the origin (located at the wire tip) are as follows:

$$l = \frac{K(p)}{k}, \frac{T}{T_e} = \left[\frac{2}{\pi}K(p)\right]^2, a = \frac{2p}{k}, b = \frac{2}{k}E(p) - l, \quad (32)$$

where, $$k = \sqrt{\frac{T}{EI}} = \frac{8}{d^2}\sqrt{\frac{T}{\pi E}} \quad (33)$$

is the parameter of the axial force, p=sin(α/2) is the module of the elliptic function, α is the angle of rotation at the free end, i.e. the angle that the tangent to the wire's elastic curve at its free end forms with the x axis, and $$K(p) = \int_0^{\pi/2} \frac{d\phi}{\sqrt{1 - p^2\sin^2\phi}}, E(p) = \int_0^{\pi/2} \sqrt{1 - p^2\sin^2\phi} \, d\phi \quad (34)$$

are the tabulated complete elliptic integrals of the first and the second kind, respectively. The values of p, $T/T_e = p/p_e$, a/l, b/l, and $\lambda/l = 1 - b/l$ computed for different α values are shown in FIG. 8. Let, for instance, the force-induced axial displacement, λ, be λ=1.208 μm, so that, with l=40 μm, we have λ/l=0.0302. Then the data shown in FIG. 8 predict that $p = 1.01534 p_e = 1.01534 \times 11.5 = 11.7$ psi.

It is advisable, whenever possible, to reach and, preferably, even to somewhat exceed the critical pressure, because in the neighborhood of the critical condition the actual pressure, as evident from Table 1 data, is not very sensitive to the change in the axial displacement. On the other hand, the sensitivity analysis based on the second formula in (26) shows that when the actual displacement is small and, as a result of that, the contact pressure is low, this pressure rapidly increases with an increase in the axial displacement. In the above example, the a/l and b/l ratios are 0.2194 and 0.9698, respectively, so that the coordinates of the wire tip with respect to its root cross-section are a=8.78 μm and b=3.88 μm. The information of the induced displacements is useful, particularly, for the selection of the adequate average spacing between the adjacent wires, so that to avoid a "spaghetti" situation, when the deflected wires touch each other and form a bundle, instead of an array, clearly undesirable from the standpoint of a consistent and predictable mechanical behavior of the WGA.

The axial compliance can be found as the ratio of the axial force-induced displacement to the corresponding axial force:

$$C = \frac{\lambda}{T} = \frac{\lambda}{T_e}\frac{T_e}{T} \quad (35)$$

Comparing this formula with the formula (30), we conclude that the factor $T_e/T$ reflects the effect of the large axial displacements of the wire tip on the wire's axial compliance. The axial induced displacement can be evaluated as $$\lambda = l - b = 2l - \frac{2}{k}E(p) \tag{36}$$

Then the formula (35) yields:

$$C = \frac{2l^3}{EI}\chi(p), \tag{37}$$

where the function $$\chi(p) = \frac{K(p) - E(p)}{K^3(p)} \tag{38}$$

considers the effect of the large deflections on the axial compliance. This function is tabulated in the table shown in FIG. 8. It is zero for zero axial displacement of the wire tip and increases with an increase in this displacement.

Following is a probabilistic approach to the analysis. The analysis below should be used merely as an illustration of what can be expected from the application of a probabilistic approach. As evident from the second formula in (26) and the formula (28), two major factors affect the contact pressure in the pre-buckling mode (provided that the Young's modulus of the material is known with sufficient certainty): the initial axial displacement $\lambda_0$, which depends on the initial curvature (initial lateral displacement), and the diameter-to-length ratio d/l. The initial curvature and the initial axial displacement are seldom known with certainty and therefore should be treated as random variables. This is especially true for CNT arrays. The diameter-to-length ratio for a CNT in a CNT array is typically not known with sufficient certainty, and should be treated, for this reason, as a random variable. In the analysis that follows we address, as an illustration, the effect of the initial curvature (axial displacement). If both the variables $\lambda_0$ and d/l are considered, a cumulative probability distribution function should be obtained for these two variables.

Let the maximum initial lateral displacement $f_0$ be a random variable, with the mean value $<f_0>$, variance $D_{f0}$ and the most likely value $f^*$. It is natural to assume that the variable $f_0$ is distributed in accordance with Weibull's law. Indeed, the sign of the displacement $f_0$ does not matter and therefore this displacement can be assumed positive. Zero value of such a displacement is physically possible, but the probability of such a situation is zero; and, finally, low values of the variable $f_0$ are more likely than high values.

The probability that the actual initial maximum deflection exceeds a certain level $f_0$ is:

$$F_f(f_0) = \exp\left[-\left(\frac{f_0}{b}\right)^a\right], \tag{39}$$

where the shape parameter, a, and the scale parameter, b, are related to the probabilistic characteristics of the random variable $f_0$ as follows:

$$\langle f_0 \rangle = b\Gamma(3/2) = b\frac{\sqrt{\pi}}{2}, \tag{40}$$

$$D_{f_0} = b^2[\Gamma(1 + 2/a) - \Gamma^2(1 + 1/a)], \ f_* = b(1 - 1/a)^{1/a}$$

where $$\Gamma(\alpha) = \int_0^\infty x^{\alpha-1} e^{-x} dx \tag{41}$$

is the gamma-function. From (25) and (26) we find:

$$f_0 = \frac{4}{\pi}\sqrt{\lambda l}\left(\frac{p_e}{p} - 1\right) \tag{42}$$

Substituting this formula into the formula (39), we conclude that the probability that the actual contact pressure does not exceed a certain level P (which, in this analysis, is always below its critical value $P_e$) is:

$$F_P(P) = \exp\left[-\left[\frac{4}{\pi}\frac{\sqrt{\lambda l}}{b}\left(\frac{p_e}{p} - 1\right)\right]^a\right] \tag{43}$$

Then the probability that the contact pressure is found within the boundaries $P_1$ and $P_2$ is $$P = [P_1 \le p \le P_2 \triangleleft p_e]\exp\left[-\left[\frac{4}{\pi}\sqrt{\frac{\lambda l}{b}}\left(\frac{p_e}{P_2} - 1\right)\right]^a\right] - \exp\left[-\left[\frac{4}{\pi}\frac{\sqrt{\lambda l}}{b}\left(\frac{p_e}{P_1} - 1\right)\right]^a\right] \tag{44}$$

In a special case of a Rayleigh distribution (a=2) we have:

$$P = [P_1 \le p \le P_2 \triangleleft p_e] = \exp\left(-\frac{P_1}{\langle p \rangle}\right) - \exp\left(-\frac{P_2}{\langle p \rangle}\right) \tag{45}$$

where $<p>$ is the mean value of the contact pressure. This value is related to the variance, $D_P$, as follows $$\langle p \rangle = \sqrt{\frac{D_P}{\frac{4}{\pi} - 1}} \tag{46}$$

Let the mean value of the contact pressure be $<p>=p_e=11.5$ psi. Then formula (45) predicts that the probability that the actual pressure is found within the boundaries of, i.e. $P_1=5$ psi and $P_1=25$ psi is p=0.6474-0.1137=0.5337=53%.

Following is now an analysis of the critical pressure of a wire embedded into an elastic medium. From the standpoint of structural analysis, a wire embedded into a LMM can be treated as a cantilever beam lying on a continuous elastic foundation provided by such a medium. It is important, however, that the spring constant of this foundation is evaluated for the case of a wire embedded into, and not actually lying on, an elastic medium.

The equation of bending, with consideration of the initial curvature, is as follows:

$$EIw^{IV}(x)+T[w^{II}(x)+w_0^{II}(x)]+Kw(x)=0, \quad (47)$$

where K is the spring constant of the foundation. The origin of the coordinate x is at the clamped end of the wire. The initial curvature can be represented as $$w_0(x) = \frac{f_0}{2}\left(1-\cos\frac{\pi x}{l_0}\right), \quad (48)$$

where $f_0$ is the maximum initial deflection, and $l_0$ is the buckled length of the wire. The expression (33) satisfies the boundary conditions:

$$w_0(0)=0, w_0^I(0)=0, w_0(l_0)=f_0, \; w_0^{III}(l_0)=0 \quad (49)$$

The solution to equation (47) in the form of the initial curvature (48) is:

$$w(x) = C\left(1-\cos\frac{\pi x}{l_0}\right) \quad (50)$$

This solution also satisfies the boundary conditions (49). After introducing the expression (48) and the sought solution (50) into equation (47), and using Galerkin's method to solve this equation, we obtain:

$$C = \frac{f_0}{\frac{EI}{T}\xi + \frac{K}{T}\frac{1}{\xi} - 1}, \quad (51)$$

where the following notation is used:

$$\xi=(\pi/l_0)^2 \quad (52)$$

Then the solution (50) results in the following formula for the elastic curve:

$$w(x) = \frac{f_0}{\frac{EI}{T}\xi + \frac{K}{T}\frac{1}{\xi} - 1}\left(1-\cos\frac{\pi x}{l_0}\right) \quad (53)$$

Within the framework of the taken approach, which is similar to the approach employed above in the analysis of a free span wire, the deflections tend to infinity, when the compressive force tends to its critical value, $T_e$. Equating the denominator in the expression (53) to zero and putting the compressive force T equal to $T_e$, the following formula for this force is obtained:

$$T_e = EI\xi + \frac{K}{\xi} \quad (54)$$

The minimum value:

$$T_e = 2\sqrt{KEI} \quad (55)$$

of this force takes place for $$\xi = \sqrt{\frac{K}{EI}} \quad (56)$$

i.e. for the buckling length $$l_0 = \pi\sqrt[4]{\frac{EI}{K}} \quad (57)$$

For large enough K values, this buckling length can be considerably lower than the wire length. Hence, this explains the reason that the critical force determined by the formula (55) is wire length independent.

The critical pressure $$p_e\frac{4}{\pi d^2}T_e = \sqrt{\frac{KE}{\pi}}, \quad (58)$$

is independent of both the wire length and its diameter. Comparing the formula (58) with the formula (28), leads to the conclusion that while the critical pressure in the case of a free span wire is proportional to the diameter-to-length ratio squared and is proportional to the Young's modulus of the wire material, the critical pressure in the case of a wire embedded into a LMM is independent of the wire length and diameter, and is proportional to the square root of the wire material modulus. This circumstance provides an incentive for using wires embedded into a low modulus medium, as far as the sensitivity of the critical pressure to the change in the wire geometry and Young's modulus of the wire material is concerned.

If, for instance, a contact pressure of 60 psi is desirable, then the spring constant of the elastic foundation provided by the embedding elastic medium should be, with E=1.28 TPa=130612 kg/mm²=1.857×10⁸ psi, as low as K=6.09× 10⁻⁵ psi. For the contact pressure of 100 psi the required spring constant is K=1.69×10⁻⁴ psi.

It is noteworthy that each term in the right part of the formula (54) contributes half of the value of the critical force expressed by the formula (55). This means that both the flexural rigidity of the wire and the spring constant of the elastic medium are equally important from the standpoint of converting the buckling mode characterized by the formula (21), in the case of a free span wire, to the mode characterized by the formula (55), in the case of a wire embedded into a low modulus medium.

Equating the formulas (28) and (55) and solving the obtained equation for the spring constant K, we conclude that the K value should not be lower than $$K_* = \pi E \left(\frac{\pi d}{8l}\right)^4, \tag{59}$$

if the mechanical behavior corresponding to the buckling force (55) is to be achieved. If, for instance, the CNT is characterized by a diameter-to-length ratio of 0.001, then with E=1.28 TPa=130612 kg/mm²=1.857×10⁸ psi, the minimum spring constant value should be higher than $K^* = 1.387 \times 10^{-5}$ psi.

Following is an analysis of spring constant of the embedding medium. The spring constant K of the embedding medium can be evaluated by the following formula obtained earlier in application to low temperature microbending of dual coated silica glass fibers:

$$K = \frac{4\pi E_0 (1-\nu)(3-4\nu)}{(1+\nu)\left[(3-4\nu)^2 \ln \frac{r_1}{r_0} - \frac{(r_1/r_0)^2 - 1}{(r_1/r_0)^2 + 1}\right]} \tag{60}$$

where $E_0$ is Young's modulus of the elastic medium, $\nu$ is its Poisson's ratio, $r_0$ is the radius of the wire's cross-section, and $r_1$ is a large enough radius, at which the disturbance introduced by the displaced wire to the stress field in the elastic medium becomes insignificant. Calculations indicate that the $r_1/r_0$ ratio in the above formula can be assumed equal to 30 for the unrestricted medium, i.e. for the situation, when the wires in a WGA are located far enough from each other and therefore deform independently. Then the following simplification of the formula (60) can be used:

$$K = \frac{4\pi E_0 (1-\nu)}{(1+\nu)(3-4\nu)\ln\frac{r_1}{r_0}} \tag{61}$$

Low modulus elastic media are typically characterized by Poisson's ratios close to 0.5. Then the formula (61) can be further simplified as follows:

$$K = \frac{4\pi}{3} \frac{E_0}{\ln\frac{r_1}{r_0}} \tag{62}$$

Comparing this formula with the formula (59) we conclude that the Young's moduli ratio $E/E_0$ should not be lower than $$\frac{E_0}{E} = \frac{3}{4}\left(\frac{\pi d}{8l}\right)^4 \ln\frac{r_1}{r_0} \tag{63}$$

to achieve the desirable effect due to the embedding medium. If, for instance, l/d=1000, then, with the radii ratio $r_1/r_0$ equal to 30, we find that the Young's moduli ratio should not be lower than $6.06 \times 10^{-14}$. With E=1.28 TPa=1.857×10⁸ psi, we have $E_0 = 1.125 \times 10^{-5}$ psi.

Following is an analysis of elastic curves and a characteristic equation. We examine a situation when the cantilever wire is loaded by a compressive T and a lateral P loads applied to its free end. The lateral load can be due, for instance, to the thermal expansion (contraction) mismatch of the dissimilar materials that the wire is in contact with. An analysis based on a linear approach is employed. It can be therefore used for displacements that do not exceed the buckling conditions. We proceed from the following equation of wire bending:

$$EIw^{IV}(x) + Tw^{II}(x) + Kw(x) = 0. \tag{64}$$

The notation is the same as in the equation (16). The origin of coordinate x is at the clamped end of the wire. The characteristic equation for the homogeneous differential equation (64) is as follows:

$$z^4 + \frac{T}{EI}z^2 + \frac{K}{EI} = 0 \tag{65}$$

This bi-quadratic equation has the following four roots:

$$z = \pm \sqrt{\frac{T}{2EI}} \sqrt{-1 \pm \sqrt{1 - \frac{T_e^2}{T^2}}}, \tag{66}$$

where the notation of equation (55) is used.

In pre-buckling mode (T◁$T_e$) formula (66) can be represented as:

$$z = \pm \gamma_1 i \gamma_2 \tag{67}$$

where $$\gamma_1 = \frac{1}{2}\sqrt{\frac{T}{EI}}\sqrt{-1 + \frac{T_e}{T}}, \quad \gamma_2 = \frac{1}{2}\sqrt{\frac{T}{EI}}\sqrt{1 + \frac{T_e}{T}} \tag{68}$$

Hence, equation (64) has the following solution:

$$w(x) = C_0 \cos h\, \gamma_1 x \cos \gamma_2 x + C_1 \cos h\gamma_1 x \sin \gamma_2 x + C_2 \sin h\gamma_1 x \sin \gamma_2 x + C_3 \sin h\gamma_1 x \cos \gamma_2 x \tag{69}$$

where $C_n$, n=0,1,2,3 are constants of integration. The boundary conditions are as follows:

$$w(0)=0, w^I(0)=0, w^{II}(l)=0, EIw^{III}(l)+Tw^I(l)+P=0 \tag{70}$$

The first two conditions indicate that the displacement and the angle of rotation at the clamped end should be zero. The third condition reflects the fact that the bending moment at the free end should be zero. The last condition is, in effect, the equation of equilibrium for the following forces. It is the projection of all the forces on the vertical axis: the lateral force due to the wire deformation, the external lateral force, P, and the projection of the external compressive load T.

The solution (69) and the boundary conditions (70) result in the following formulas for the constants of integration:

$$C_0 = 0, \quad C_1 = \tag{71}$$

$$-\frac{\gamma_1}{\gamma_2}C_3 = \frac{P}{T}\sqrt{\frac{\eta-1}{\eta}}\sqrt[4]{\frac{4EI}{K}}\frac{\sqrt{\eta^2-1}\cosh u \cos v - \sinh u \sin v}{\eta D}$$

$$C_2 = -\frac{P}{T}\sqrt{\frac{\eta-1}{\eta}}\sqrt[4]{\frac{4EI}{K}}\frac{\sinh u \sin v + \sqrt{\eta^2-1}\cosh u \cos v}{D}$$

-continued where $\eta = T_e/T, u = \gamma_1 l, v = \gamma_2 l$, and $$D = \frac{1}{2}\cosh^2 u[(\eta+1)\tanh^2 u \cos^2 v - (\eta-1)\sin^2 v] + \frac{1}{\eta}\cosh^2 u[\tanh^2 u \sin^2 v - (\eta^2-1)\cos^2 v] \quad (72)$$

For a long enough wire the formulas (71) and (72) can be simplified:

$$C_0 = 0, C_1 = \frac{\gamma_1}{\gamma_2}C_3 = \frac{2P}{T}\sqrt{\frac{\eta-1_4}{\eta}}\sqrt{\frac{4EI}{K}}\frac{1}{\cosh u}\frac{\sqrt{\eta^2-1}\cos v - \sin v}{(1+\eta)(2-\eta)},$$

$$C_2 = -\frac{2P}{T}\sqrt{\frac{\eta-1_4}{\eta}}\sqrt{\frac{4EI}{K}}\frac{1}{\cosh u}\frac{\sqrt{\eta^2-1}\cos v + \sin v}{(1+\eta)(2-\eta)} \quad (73)$$

Considering the formula (57) for the buckling length, we conclude that the constants of integration and, hence, the ordinates of the deflection function are proportional to this length. An exemplary and non-limiting elastic curve 910 for equation (69) of a deflected wire is plotted in FIG. 9 for the case:

$l=40$ μm, $d=40$ nm, $K=10^{-4}$ kg/mm², $E=1.3509 \times 10^5$ kg/mm²$=1.32$ TPa, $T=0.95 T_e$.

Buckling Mode ($T=T_e$)

In buckling mode ($T=T_e$) equation (64) has the following solution:

$$w(x) = C_1 \sin \gamma x + C_2 \gamma x \sin \gamma x + C_3 \cos \gamma x + C_4 \cos \gamma x, \quad (74)$$

where $$\gamma = \sqrt{\frac{T}{2EI}} \quad (75)$$

The boundary conditions (70) yield:

$$C_1 = -C_4 = \frac{2P}{T\gamma}\frac{2\cos u - u \sin u}{u^2 - 4 + 3\sin^2 u}, \quad (76)$$

$$C_2 = -\frac{2P}{T\gamma}\frac{\sin u + u \cos u}{u^2 - 4 + 3\sin^2 u}, C_3 = 0,$$

where $u = \gamma l$. An exemplary and non-limiting elastic curve 920 of equation (74) of a wire is plotted in FIG. 9. All the input data, except the axial force, are the same as in the example for the pre-buckling mode.

In post-buckling mode ($T \triangleright T_e$) this case the equation (64) has the following solution:

$$w(x) = C_1 \sin \gamma_1 x + C_2 \cos \gamma_1 x + C_3 \sin \gamma_2 x + C_4 \cos \gamma_2 x \quad (77)$$

where $$\gamma_1 = \sqrt{\frac{T}{2EI}\left(1 + \sqrt{1 - \frac{T_e^2}{T^2}}\right)}, \gamma_2 = \sqrt{\frac{T}{2EI}\left(1 - \sqrt{1 - \frac{T_e^2}{T^2}}\right)}, \quad (78)$$

and the constants of integration are as follows:

$$C_1 = -\frac{\gamma_2}{\gamma_1}C_3 = -\frac{P}{EID}(\gamma_1^2 \cos u - \gamma_2^2 \cos v), \quad (79)$$

-continued $$C_2 = -C_4 = \frac{P\gamma_1}{EID}(\gamma_1 \sin u - \gamma_2 \sin v)$$

where $$D = \gamma_1[2\gamma_1^2\gamma_2^2 - \gamma_1\gamma_2(\gamma_1^2 + \gamma_2^2)]\sin u \sin v - (\gamma_1^4 + \gamma_2^4)\cos u \cos v] \quad (80)$$

An exemplary and non-limiting elastic curve 930 of equation (77) is plotted in FIG. 9 for $T=1.05 T_e$. All the input data, except the axial force, are the same as in the example for the pre-buckling mode.

The design for contact pressure involves the computed Young's moduli of the low modulus embedding medium ($E^0 \times 10^7$ psi) and length-to-diameter ratios (l/d) for CNTs for the given (vs) Young's moduli of the CNT (E, TPa) and the desired/required contact pressures ($P_e$, psi) are shown in FIG. 10. The table data can be used for actual physical design of a CNT array (forest) module. The length-to-diameter ratios in this table are based on the requirement that the buckling force in the case of a wire embedded into a low modulus medium is the same as in the case of a free-span wire. This gives an additional assurance that the design is stable enough, as far as the contact pressure is concerned. The data shown in FIG. 10 are based on an assumption that the entire area is covered by the WGA. If only a portion of the array covers the interface, and/or a slightly oblique loading takes place, then the critical pressure in the table should be multiplied by the corresponding reduction factor.

If, for instance, one wishes to achieve a constant pressure of 60 psi, and the Young's modulus of the CNT material is 1.0 Tpa, then a low modulus medium with the Young's modulus of 0.00006329 psi should be used and CNTs with the length-to-diameter ratio of 611 should be employed. If the diameter of the CNTs is, for example, 40 nm, then the length of the CNTs should be 24.4 microns.

The following conclusions can be drawn from the above analysis:
a) Simple formulas have been developed for the evaluation of the contact pressure due to, and of the deformed shapes (elastic curves) of, the bent WGA wires in WGA designs;
b) There is an incentive to use wires embedded in LMM for the reduced sensitivity of the contact pressure to the geometric characteristics of the wires;
c) A probabilistic analysis should be employed for the prediction of the probabilistic characteristics of the bent wires in WGA designs; and The conclusions herein are not intended to limit the invention disclosed but rather provide a theoretical analysis to the invention.

Accordingly, although the invention has been described in detail with reference to a particular preferred embodiment, those possessing ordinary skill in the art to which this invention pertains will appreciate that various modifications and enhancements may be made without departing from the spirit and scope of the claims that follow.

The invention claimed is:

1. An apparatus for the efficient removal of heat from a hot surface, the apparatus comprises: an anchoring surface wherein the root portions of each of a plurality of wires is anchored to said anchoring surface; a base inside of which said anchoring surface is mounted; a low modulus continuous medium (LMM), said plurality of wires being at least partially embedded within said LMM; a support structure designed to support said plurality of wires placed in said LMM; and, means for applying axial forces to the free ends of said plurality of wires, when said base is forced against said hot surface; wherein said axial forces cause the bending deformation of at least one of said plurality of wires against said hot surface thereby increasing at least one of: the number of wires from said plurality of wires having thermal contact to said hot surface, the thermal contact area between said hot surface and said at least one of said plurality of wires, and wherein an upper portion of said at least one of said plurality of wires is coated with a material resistant to wetting, said wetting resistant material comprising a creep barrier for said LMM.

2. An apparatus for the efficient removal of heat from a hot surface, the apparatus comprises: an anchoring surface wherein the root portions of each of a plurality of wires is anchored to said anchoring surface; a base inside of which said anchoring surface is mounted; and, means for applying axial forces to the free ends of said plurality of wires, when said base is forced against said hot surface; wherein said axial forces cause the bending deformation of at least one of said plurality of wires against said hot surface thereby increasing at least one of: the number of wires from said plurality of wires having thermal contact to said hot surface, the thermal contact area between said hot surface and said at least one of said plurality of wires, wherein contact of pressure a wire against said hot surface is a result of at least one of said axial forces and is only a function of the ratio between the length and the diameter of said at least one of said plurality of wires, and wherein said contact pressure is in the range between 20 and 60 psi.

3. The apparatus of claim 2, wherein the ratio between the length and the diameter of said at least one of said plurality of wires is between 400 and 1,200.

4. An apparatus for the efficient removal of heat from a hot surface, the apparatus comprises: an anchoring surface wherein the root portions of each of a plurality of wires is anchored to said anchoring surface; a base inside of which said anchoring surface is mounted; a low modulus continuous medium (LMM), said plurality of wires being at least partially embedded within said LMM; a support structure designed to support said plurality of wires placed in said LMM; and, means for applying axial forces to the free ends of said plurality of wires, when said base is forced against said hot surface; wherein said axial forces cause the bending deformation of at least one of said plurality of wires against said hot surface thereby increasing at least one of: the number of wires from said plurality of wires having thermal contact to said hot surface, the thermal contact area between said hot surface and said at least one of said plurality of wires, wherein said at least one of said plurality of wires being subjected to a lateral loading, wherein said lateral loading is achieved by means of coating said at least one of said plurality of wires, and wherein said coating is of a sufficient weight to bring said at least one of said plurality of wires up to, but less than, a buckling condition of said at least one of said plurality of wires.

* * * * *